United States Patent [19]
Koduri

[11] Patent Number: 5,934,543
[45] Date of Patent: Aug. 10, 1999

[54] WIRE BONDING CAPILLARY HAVING ALIGNMENT FEATURES

[75] Inventor: Sreenivasan Koduri, Dallas, Tex.

[73] Assignee: Texas Instuments Incorporated, Dallas, Tex.

[21] Appl. No.: 08/991,723

[22] Filed: Dec. 16, 1997

[51] Int. Cl.⁶ ............................. H01L 21/60; B23K 20/10
[52] U.S. Cl. ..................... 228/102; 228/180.5; 228/4.5; 228/56.5
[58] Field of Search ................ 228/4.5, 8, 56.5, 228/102, 180.5

[56] References Cited

U.S. PATENT DOCUMENTS

| | | | |
|---|---|---|---|
| 5,215,940 | 6/1993 | Orcutt et al. | 228/180.5 |
| 5,364,009 | 11/1994 | Takahashi et al. | 228/180.5 |
| 5,465,899 | 11/1995 | Quick et al. | 228/180.5 |
| 5,544,804 | 8/1996 | Test et al. | 228/180.5 |

*Primary Examiner*—Patrick Ryan
*Assistant Examiner*—Jeffrey T. Knapp
*Attorney, Agent, or Firm*—W. James Brady III; Richard L. Donaldson

[57] ABSTRACT

A capillary (10) is provided for use in wire bonding and may be incorporated into a wire bonding machine. The capillary (10) incorporates one or more indicators (100, 105, 110, 113) which may be positioned about the capillary. For example, the indicators may be affixed to an outer surface of the capillary. Sensing of a indicator may be achieved by a detector (160) to determine the angular position of the indicator. This may be used to determine and/or establish the angular alignment of the capillary. The angular alignment may correspond to a desired axis of a wire bonding machine table or lead frame, or to a longitudinal axis of a lead on a lead frame, in order to achieve optimum effectiveness in wire bonding between an integrated circuit chip and the leads of the lead frame. The capillary may be any of a number of differing types including those having circular and non-circular faces. The indicators may be any of a number of differing types including passive, active, contact, contactless, electrical, mechanical, magnetic, optical, or other types.

21 Claims, 3 Drawing Sheets

WIRE BONDING CAPILLARY HAVING ALIGNMENT FEATURES

TECHNICAL FIELD OF THE INVENTION

The present invention generally relates to capillaries used in the wire bonding process during the manufacture of electronic integrated circuit chip packages and, more particularly, to a wire bonding capillary having alignment features.

BACKGROUND OF THE INVENTION

Integrated circuit chip packages are typically formed by mounting an integrated circuit chip on a lead frame and coupling these two elements to form a package. The integrated circuit chip and lead frame may be encapsulated. Typically, the chip includes a number of bond pads which may be positioned about a perimeter of the chip according to a predetermined spacing between the bond pads. The lead frame typically includes a number of leads about a perimeter thereof. One type of lead frame, for example, has a generally rectangular shape with each side of the rectangle having a number of leads. The leads may each have a relatively narrow elongated shape.

A lead frame may be said to have an X direction and a Y direction. The X direction is perpendicular to one pair of opposing sides and the Y direction is perpendicular to the other pair of opposing sides. Typically, each lead has a relatively narrow elongated shape defining a lead axis. The lead axis for any given lead frame may extend in the X or Y direction, or be offset by an angle from either the X or Y direction. The angle of offset may vary from lead to lead. Moving from the center of a given side of the lead frame toward the corner leads, the lead axes may be angularly offset from perpendicular by increasing amounts. Also, a bonding path is defined by the direction from a bond pad to a corresponding lead. The bonding wire may extend along the bonding path. For any given set of corresponding bond pads and leads, the bonding path may extend in the X or Y direction, or be offset by an angle from either the X or Y direction.

In order to electrically couple the integrated circuit chip to the leads of the lead frame, a wire bonding technique is often used. A wire bonding machine may have a spool of bonding wire mounted on the machine. The bonding wire may be threaded through a capillary which is mounted to a horn of the wire bonding machine. The horn may be manipulated to move the capillary both vertically and horizontally. Typically, the wire bonding machine includes a device for heating or applying a spark to an end of the bonding wire which protrudes from an exit end of the capillary. The molten wire may form the shape of a ball which is placed on a target bond pad by manipulating the horn to move the capillary.

After this bond pad bond is created, a sufficient amount of bonding wire is released to allow the capillary to be moved to a location near an inner end of a target lead of the lead frame. The capillary is manipulated to connect the bonding wire to the inner end of the target lead and cut off the bonding wire so that the bonding wire protruding from the exit end of the capillary is now free to form a new wire bond between a new target bond pad and target lead. Any type of suitable bond may be made at either the bond pad or the lead, including ball bonds, stitch bonds and wedge bonds. A ball bond may be used, for example, at the bond pad. A stitch bond may be used, for example, at the lead. To complement the bonding process the package may be heated. Also, ultrasonic energy may be applied.

Problems in wire bonding techniques arise in part from the desire to increase the number of leads in a given package and to make integrated circuit chip packages smaller and smaller. This may require that the bonding pads located on the chip be made smaller and be spaced closer together. The same can be said for the leads on a lead frame.

The exit end of a wire bonding capillary is often referred to as the capillary face. Previous capillaries have had a circular face. A disadvantage of having a capillary with a circular face is that the spacing between bonds is limited. After a bond is made at a particular bond pad, for example, if the adjacent bond pad is too close then the capillary face may strike the ball bond which has been made at the first bond pad during the process of making a bond on the adjacent bond pad. One method for solving this shortcoming is to use a wire bonding capillary with a non-circular face. This type of approach is shown, for example, in U.S. Pat. No. 5,544,804 issued to Test et al., which is hereby incorporated by reference for all purposes. The Test et al. patent shows a BowTI™ capillary having a non-circular face. The face of a BowTI™ capillary may have a shape which includes a pair of opposed convex sides joining a pair of opposed concave sides. The BowTI™ capillary may be generally described as having a longitudinal axis extending across the midpoints of the convex sides and through the center of the BowTI™. The BowTI™ capillary allows ball bonds, for example, to be made closer to one another than with a circular capillary face. This can be accomplished because the concave sides avoid striking adjacent bonds. The BowTI™ capillary can also make other types of bonds including stitch bonds.

A need arising from the use of capillaries having non-circular faces is precise alignment of the longitudinal axis of the capillary face along either the X or Y direction of the lead frame, or along the longitudinal axis of a target lead, or along a given bonding path as necessary. Precise alignment of non-circular capillaries is especially difficult due to the relatively small size of a typical capillary face (e.g., 4–8 mils). Improper alignment of the capillary, particularly in view of the decreasing size of integrated circuit chip packages, can lead to defective wire bonds during the manufacturing process. This can result from many factors including improper positioning of the capillary face over the bond pad, the lead or both. Defective wire bonding can also occur when improper alignment causes the capillary to strike and/or damage an existing bond during the formation of a subsequent bond. Other problems, shortcomings and disadvantages of known capillaries and wire bonding techniques exist.

SUMMARY OF THE INVENTION

It is an object of the present invention to address the needs associated with capillaries used in wire bonding.

It is a further object of the present invention to address the needs associated with known wire bonding techniques.

It is a further object of the present invention to provide a capillary for a wire bonding machine which may be easily aligned during installation of the capillary into the wire bonding machine.

It is a further object of the present invention to provide a capillary for wire bonding which may be easily aligned and realigned during the process of manufacturing an integrated circuit chip package.

It is a further object of the present invention to provide a capillary, the alignment of which may be easily established and/or checked during use of the capillary.

To accomplish these and other objects of the present invention, a capillary is provided for use in wire bonding. The capillary has a tubular body having a longitudinal axis. The capillary includes at least one indicator incorporated into the tubular body, so that an angular alignment of the capillary corresponds to an angular position of the at least one indicator about the longitudinal axis of the tubular body.

According to various aspects of the invention, the indicators may be passive or active and contact-type or contactless. The indicators may be electrical, mechanical, optical or magnetic. The capillary may be incorporated into a wire bonding machine. The wire bonding machine may include a detector for detecting the indicator or a signal provided by the indicator.

According to another embodiment, a method is provided in which a capillary may be angularly aligned. To do this, a first predetermined angular alignment of the capillary is established. A first indicator is incorporated into the capillary, so that an angular position of the first indicator corresponds to an angular alignment of the capillary. A first angular position of the first indicator is detected to determine the angular alignment of the capillary. The first angular position of the first indicator is compared to the first predetermined angular alignment to determine a first angular offset of the capillary from the first predetermined angular alignment. The capillary may then be rotated by the amount and direction of the first angular offset.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

Figure 1:
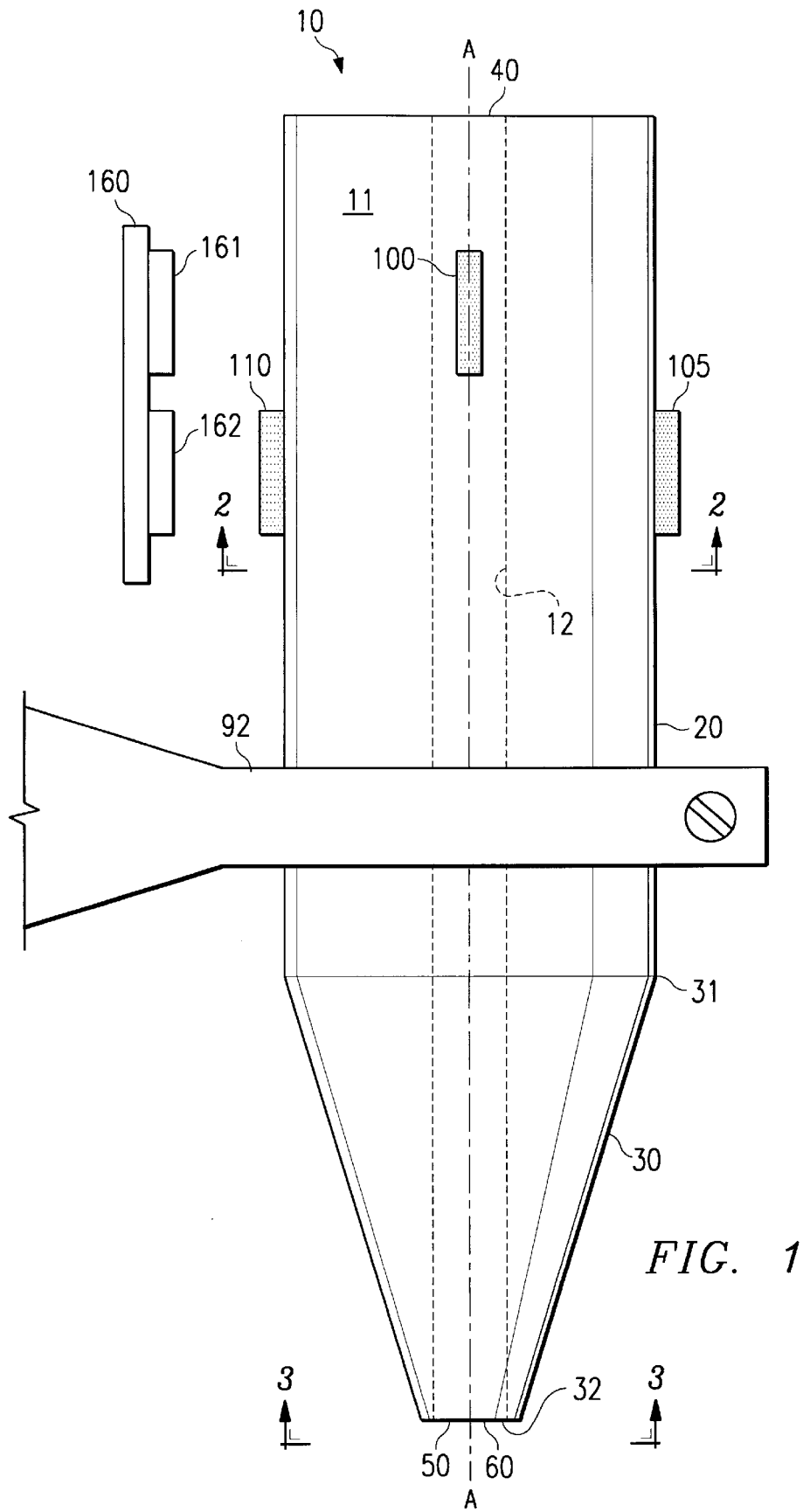
FIG. 1 is a capillary alignment structure in accordance with a first embodiment of the present invention.

Wire bonding machines are generally known. A typical wire bonding machine includes a spool of bonding wire which may comprise any suitable bonding material such as gold. The bonding wire is fed through a guide which is generally known as a capillary. This capillary also acts as the bonding tool. The capillary is mounted on an arm of the wire bonding machine known as a horn. The present invention, among other things, contemplates incorporating one or more indicators into the capillary to assist in a process of aligning the capillary during installation of the capillary onto the wire bonding machine and during the manufacturing process in which the capillary is manipulated to provide bonds between an integrated circuit chip and the leads of a lead frame. Signals from the indicators are received by one or more detectors. The signals indicate the rotational alignment of the capillary and, therefore, the direction along which an axis of the capillary face extends.

A wire bonding system may include a wire bonding machine which has a horn. A capillary is mounted into the horn and guides bonding wire from a source to various bonding points on the integrated circuit chip package. The capillary may have one or more indicators located thereon which provide one or more signals to be received by one or more detectors spaced from the capillary. The signals indicate the rotational alignment of the capillary. Therefore, the signal also indicates the direction of an axis of the face of the capillary. Each signal may have a relative signal strength which indicates an angular offset of the capillary face compared to a predetermined, desired alignment.

During operation, the capillary may be rotated to a first rotational alignment at which the capillary face axis extends in a first direction. A first signal received by the detector indicates when the first rotational alignment has been achieved. A first bond may then be made at a first bond point (e.g., at a bond pad on the integrated circuit chip) by guiding the capillary to the first bond point.

The capillary may then be realigned by rotating the capillary to a second rotational alignment so that the capillary face axis extends in a second direction different from the first direction. A second bond may then be made at a second bond point (e.g., at a lead on the lead frame) by guiding the capillary to the second bond point.

The capillary may then be rotated back to the first direction or to a third direction for a subsequent bond (e.g., at a second bond pad on the integrated circuit chip). Rotation of the capillary is achieved by the cooperation of the indicators and detectors and the production of signals which indicate rotational alignment and realignment. The ability to precisely rotate the capillary is especially beneficial for capillaries with non-circular faces. An axis of a non-circular face is ideally aligned in the direction of bonding when a bond is made. For example, it may be desirable to align the capillary face axis along the lead axis. Furthermore, as wire bonds are made around an integrated circuit chip package, the direction of bonding may change. The present invention is adapted to changing bonding directions. Further aspects of an overall capillary alignment system are disclosed in U.S. patent application Ser. No. 08/993,638 (Attorney Docket No. TI-24970) which is assigned to Texas Instruments Incorporated. This application was filed on Dec. 18, 1997 and is hereby incorporated by reference for all purposes.

Figure 3:
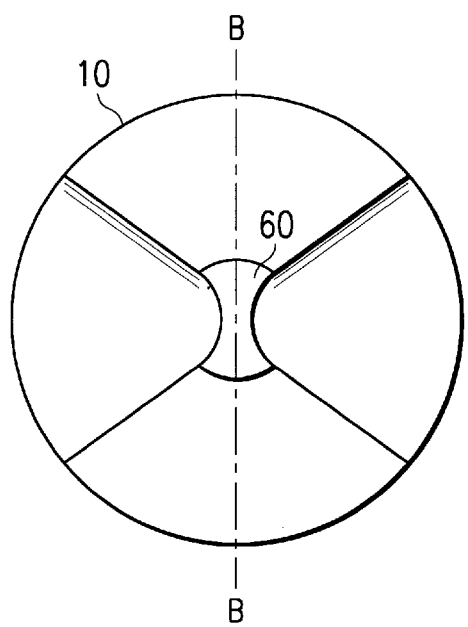
FIG. 3 is an end view of the capillary of FIG. 1 viewed in the direction of arrows 3—3 in FIG. 1.

As shown in greater detail in FIG. 1, capillary 10 is mounted onto horn 92 of a wire bonding machine. Capillary 10 has a tubular body comprising a shaft portion 20 which is integral with a tip portion 30. The capillary has a longitudinal axis extending through the interior of the capillary in the general direction shown as line AA in FIG. 1. Capillary 10 has an entry end 40 and an exit end 50. Bonding wire may be inserted into entry end 40 to extend through the interior of capillary 10 and exit from capillary 10 through exit end 50. As shown in FIG. 3, as described in greater detail below, the capillary preferably has a non-circular face 60.

Figure 2:
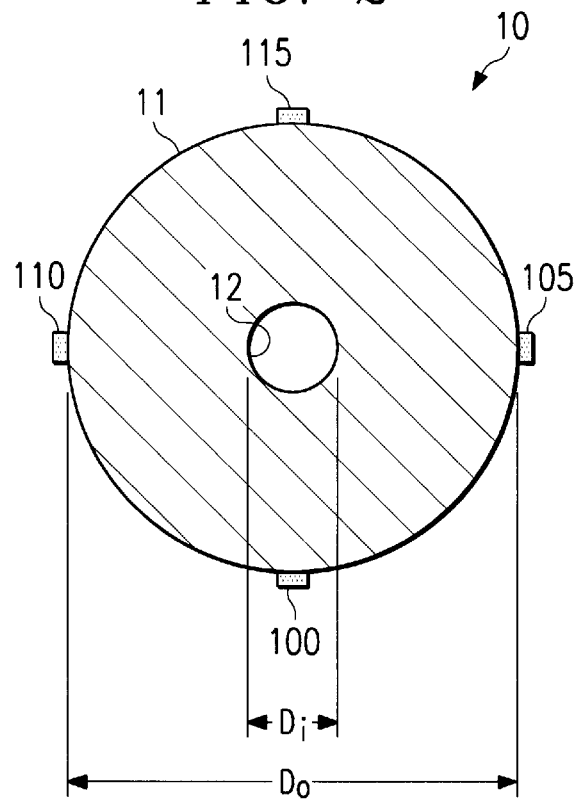
FIG. 2 is a cross-sectional view of the capillary of FIG. 1 taken along arrows 2—2 in FIG. 1.

Preferably, shaft portion 20 is cylindrical in shape and has a circular cross section as shown more clearly in FIG. 2. However, other shapes may be used so long as the bonding wire may be threaded through the interior of capillary 10. For example, the capillary may have a rectangular or elliptical cross section. Preferably, the interior of capillary 10 is defined by an inner diameter $D_i$ and an outer diameter $D_o$. Preferably, inner diameter $D_i$ is constant throughout an entire length of capillary 10. However, if capillary 10 has a constant wall thickness, then $D_i$ will vary accordingly to changes in $D_o$.

Preferably, tip portion 30 is tapered from a first point 31, where tip portion 30 meets shaft portion 20, to a second point 32 located at the exit end of capillary 10. Preferably, the outer diameter of tip portion 30 at first point 31 is equal to $D_o$ of shaft portion 20. Preferably, the outer diameter of tip portion 30 at second point 32 is a predetermined value which is less than the outer diameter at first point 31.

Capillary 10 may be formed from any suitable material. However, it is preferable that capillary 10 is formed from a high-strength ceramic material.

As shown in FIG. 2, capillary 10 has a circular cross section. Capillary 10 is defined by outer surface 11 and inner surface 12. A plurality of indicators 100, 105, 110 and 115 are incorporated into the tubular body of capillary 10. Although four indicators are shown, the number of indicators used may be one or more than one. Preferably, the indicators are provided about outer surface 11 of capillary 10. These indicators may be separately formed and affixed to the outer surface 11 of capillary 10 after capillary 10 has been formed. For example, depending upon the type of material used to make a particular indicator, the indicator may be bonded to outer surface 11 by a suitable bonding material which is capable of forming a secure bond between the material of the indicator and the material of the capillary.

Alternatively, the indicator may be incorporated into the capillary itself during manufacture of the capillary. For example, the indicator could be provided at the same time the capillary face is formed. This would aid in ensuring proper angular alignment of the indicator relative to a longitudinal axis of the capillary face. During operation, a desired angular alignment of capillary 10 corresponds to an angular position of at least one indicator about the longitudinal axis AA of the tubular body of capillary 10.

Preferably, at least one of the indicators is a primary indicator. For example, in FIG. 2, indicator 100 is a primary indicator. Primary indicator 100 may be used, for example, as the indicator which provides precise initial alignment of capillary 10. The remaining indicators 105, 110 and 115 are secondary indicators, and may be used to determine angular offsets of capillary 10 or to provide realignment of capillary 10 during wire bonding. Primary indicator 100 may be spaced longitudinally, either above or below, secondary indicators 105, 110 and 115. This permits easy identification of the primary indicator. During operation, the primary indicator may be positioned on capillary 10 to correspond to a first predetermined angular alignment of the capillary. A secondary indicator may be positioned to correspond to a second predetermined angular alignment of the capillary. Preferably, each of the indicators are positioned closer to entry end 40 than to exit end 50. This will provide sufficient clearance between the capillary tip and the indicators so that the sensing function will not be affected by operation of the wire bonding machine. Also, if the indicators are too close to the tip of the capillary, they may be subject to damage from heat supplied by the heating element.

The dimensions of a given indicator depend upon the particular application, type of indicator and desired function of the indicator. In at least some applications, it is preferable to have an indicator that is relatively narrow in its horizontal dimension and relatively long in its longitudinal dimension. The relatively narrow width prevents sensing by a detector unless the capillary is properly aligned. The relatively long length provides a larger longitudinal region for the sensing function to be performed. In other words, there is more longitudinal space to detect the indicator or a signal from the indicator. Preferably, the indicator's longitudinal dimension is at least as long as its horizontal dimension. More preferably, the longitudinal dimension is longer than the horizontal dimension. Even more preferably, the longitudinal dimension is at least twice as long as the horizontal dimension. The preferred shape of the indicator will also depend upon the indicator type, application and desired function. A rectangular shape may be used. However, other shapes may be appropriate such as circular, triangular or elliptical shapes.

The indicator may be of a variety of types including both passive and active indicators. Preferably, the indicators are passive. This avoids the need for incorporating a power source, chemicals or complicated electronic circuitry into the indicator. Preferably, the indicators are also contactless. This means that no external components need to come into contact with the indicators in order to provide the sensing function necessary to achieve alignment.

For example, the indicator may be an optical indicator. The indicators may comprise a strip of paint applied to the exterior of the capillary. For example, a white capillary may have black, silver, or some other color paint strips applied to the capillary exterior surface to function as indicators. Alternatively, the indicator may comprise a reflector or mirror or a highly polished material.

If paint strips are used, for example, the strips may be detected by a detection device 160. Detection device 160 may include detector 161 at position corresponding to the longitudinal location of the primary indicator and detector 162 corresponding to the longitudinal location of the secondary indicators. Detectors 161 and 162 detect the indicators or signals provided by the indicators. For instance, detectors 161 and 162 may comprise laser detectors for optically sensing paint strip indicators on the capillary surface.

If a mirror is used, for example, a beam of light from a source (not shown) may be directed to the mirror and reflected from the mirror to be received by one or both of the detectors. The detectors should be positioned so as to receive a reflected beam of light when the indicator is in a position corresponding to a predetermined desired alignment. For example, primary indicator 100 may be positioned on capillary 10 such that when primary indicator 100 is in a first predetermined position, capillary 10 is in a precisely correct initial alignment. This is particularly useful when the face 60 of capillary 10, which is located at the exit end 50, is a non-circular face. For example, in FIG. 3, the face 60 of capillary 10 is shown from an end view taken along line 3—3 of FIG. 2. Non-circular capillary face 60 has longitudinal axis BB which may be aligned, for example, with an X axis of a lead frame 70. Preferably, during operation, axis BB is aligned with the longitudinal axis of a target lead (not shown). When primary indicator 100 is in the first predetermined position, a longitudinal axis BB of capillary face 60 is preferably aligned in a desired orientation. For example, in the initial state it may be desired that longitudinal axis BB is aligned with the X axis of lead frame 70 which is undergoing the wire bonding process.

A second type of contactless indicator which may be used is a magnetic indicator. In this case, the indicator may be formed from a magnetic material and the corresponding detector may be formed from a complimentary material which causes a measurable magnetic attraction between the detector and the indicator. The magnetic attraction would naturally be strongest when the indicator and detector are in closest proximity. In the case of a capillary having a shaft with a circular cross section, such as shown in FIG. 2, for any given indicator there will only be one point when the magnetic indicator and the detector are in this closest proximity. It is preferable that the capillary 10 is in the desired alignment at this point. For example, when primary indicator 100 and detector 161 are in their closest proximity, it may be desirable to have the longitudinal axis of a non-circular capillary face 60 be aligned as desired for the initial state (e.g., aligned with the X or Y axis of the lead frame as described above).

A contact indicator may also be used. One type of contact indicator is an electrical indicator. This may comprise any conductive material. Preferably, if the indicator is in the appropriate location such that capillary 10 is aligned as desired, a detector, which may comprise, for example, a pair of electrical leads coupled to an electrical circuit, will be in contact with the indicator. The indicator thus completes the electrical circuit which may signal detection and, therefore, proper alignment of the capillary.

A mechanical indicator may also be used. A mechanical indicator may comprise a notch, a hole, a protrusion or some other mechanical-type feature which may be sensed upon contact by a detector. As another example, part or whole of the capillary outer surface may be rectangular. A mechanical indicator may also be contactless. For example, a laser may be used as the detector to detect a mechanical indicator without physical contact.

Preferably, the indicators are proximity-type indicators. This means that detection or sensing is determined by how close the indicator is to the detector. According to one possible configuration, sensing is only achieved when the indicator and detector are in their closest proximity to one another. According to an alternative configuration, a variable strength detection signal is provided and the detection signal is strongest when the indicator and detector are in their closest proximity to one another. The signal weakens as the detector and indicator move away from one another. For example, depending on the type of indicator and detector used, a detection signal may still be produced even if the capillary is angularly offset from the initial alignment. In this case the angle of offset may be determined from the relative strength or weakness of the detection signal with reference to a minimum value (as when the indicator is furthest from the detector) and a maximum value (as when the indicator and detector are in closest proximity).

Figure 4:
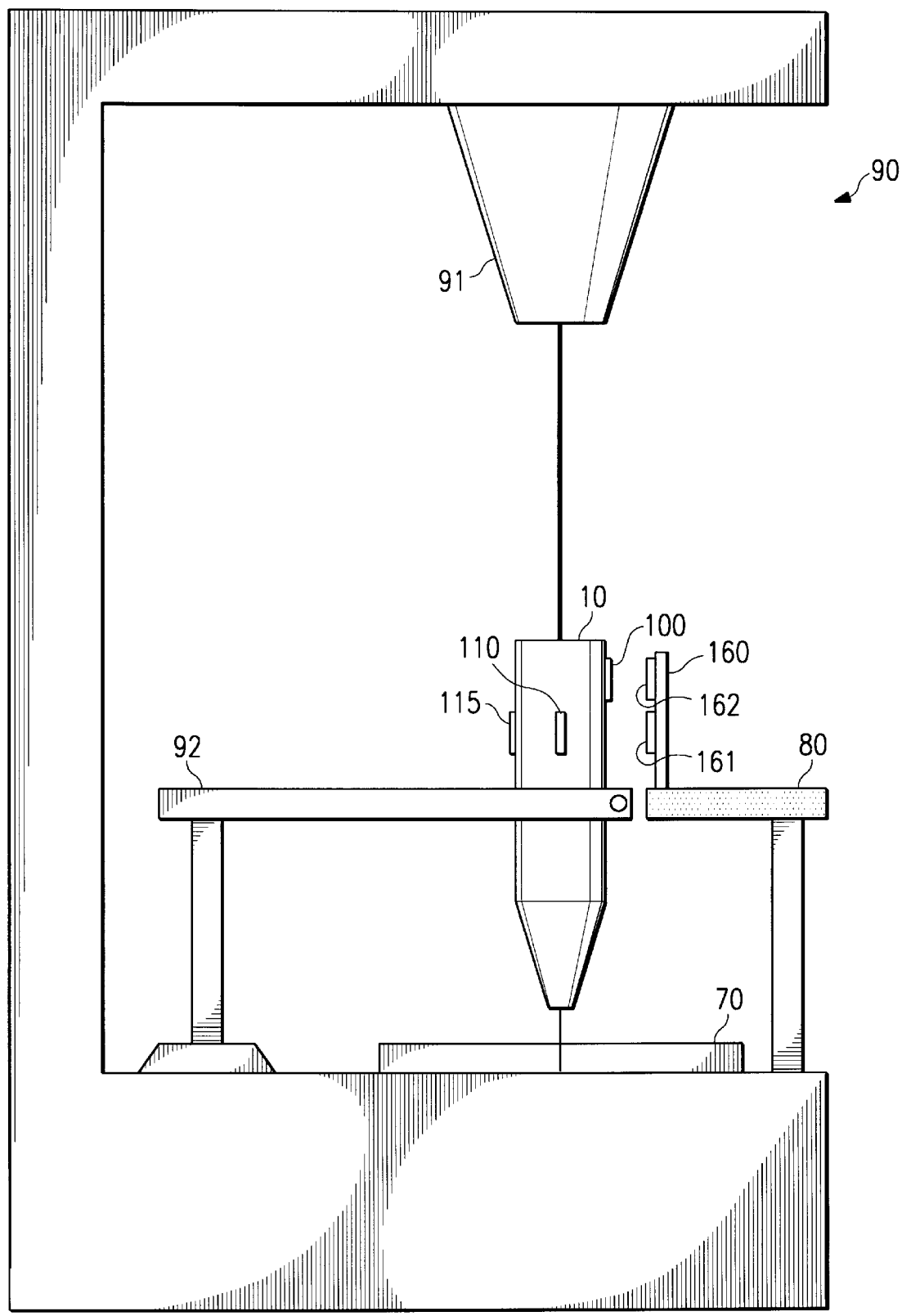
FIG. 4 is a wire bonding machine in accordance with a second embodiment of the present invention.

According to another embodiment of the present invention, capillary 10 may be incorporated into a wire bonding machine 90 as shown in FIG. 4. Wire bonding machine 90 includes a source 91 of bonding wire and a horn 92 to hold and manipulate capillary 10 during wire bonding of an integrated circuit chip to a lead frame 70. In FIG. 4, primary indicator 100 is shown in its closest proximity with detector 161 of detection device 160. Device 160 also includes detector 162 for detecting the secondary indicators. FIG. 4 is shown as an example of the operation of a capillary having one or more indicators. If the capillary is properly aligned in accordance with the wire bonding structure of FIG. 4, then accurate bonding along specific angular directions may be precisely achieved.

If it is necessary to rotate capillary 10, then sensing of one or more of the secondary indicators 105, 110 or 115 can be accomplished to ensure that capillary 10 is aligned in accordance with the exact amount of angular offset required. For example, if capillary 10 is rotated ninety degrees in either direction, then the BowTI™ face of capillary 10 will be perfectly aligned for bonding in the Y direction of lead frame 70. In this case, depending upon which direction (clockwise or counterclockwise) capillary 10 is rotated, either secondary indicator 105 or secondary indicator 110 will be sensed by detector 162 when capillary 10 is correctly aligned. Alternatively, sensing of the angular offset of primary indicator 100 may accomplish this same objective.

In another example, it may be desirable to rotate the capillary so that it is angularly offset from an X or Y axis by a predetermined amount. For instance, the desired angular offset from the initial point might be thirty degrees clockwise from the X axis. In this situation, a detection signal produced by detector 161 detecting primary indicator 100 (or a signal therefrom) will be weaker than if detector 161 and indicator 100 were in closest proximity. The relative strength of the detection signal can be used to determine whether the capillary is properly offset. In other words, by calibration or some other suitable technique, a signal strength would correspond to a particular angular offset.

According to another embodiment of the present invention, a method is provided for aligning capillary 10 by using one or more indicators. To achieve proper alignment, a first predetermined angular alignment of the capillary is established. A first indicator is incorporated into the capillary, so that an angular position of the first indicator corresponds to the angular alignment of the capillary. A first angular position of the first indicator is detected to determine the angular alignment of the capillary. The first angular position of the first indicator is compared to the first predetermined angular alignment to determine a first angular offset of the capillary from the first predetermined angular alignment. The capillary is rotated in the correct direction by the amount of the first angular offset to align the capillary according to the first predetermined angular alignment.

After a capillary is rotated, a second angular position of the first indicator may be detected to determine the angular alignment of the capillary. The second angular position of the first indicator may be compared to the first predetermined angular alignment to determine a second angular offset of the capillary from the first predetermined angular alignment. The capillary may then be rotated according to the second offset.

According to a feature of this embodiment, a second indicator may be incorporated into the capillary, so that an angular position of the second indicator corresponds to an angular alignment of the capillary. A first angular position of the second indicator may be detected to determine the angular alignment of the capillary. The first angular position of the second indicator may be compared to the first predetermined angular alignment to determine an angular offset of the capillary from the first predetermined angular alignment. According to other features, an angular offset determined by one indicator's position may be compared to another indicator's angular offset in order to check and establish exact alignment.

The present invention has thus been described in connection with the preferred embodiments. These embodiments are intended as examples only and it will be appreciated by those having ordinary skill in the art that modifications may be easily made to these embodiments without materially departing from the scope and spirit of the invention as defined by the appended claims. For example, indicators may be provided on any type of capillary which is used for wire bonding or similar processes. It will also be noted that any type of capillary face may be incorporated into the present invention. These include any circular or non-circular type capillary faces.

What is claimed is:

1. A capillary for use in wire bonding, the capillary comprising:

a tubular body having a longitudinal axis; and at least one indicator incorporated into the tubular body, wherein an angular alignment of the capillary corresponds to an angular position of the at least one indicator about the longitudinal axis of the tubular body.

2. The capillary of claim 1, wherein the at least one indicator comprises a primary indicator corresponding to a first predetermined angular alignment of the capillary and at least one secondary indicator corresponding to a second predetermined angular alignment of the capillary.

3. The capillary of claim 1, wherein the at least one indicator comprises a first indicator and a second indicator, the first indicator being angularly offset from the second indicator.

4. The capillary of claim 1, wherein the at least one indicator comprises a first indicator and a second indicator, the first indicator being longitudinally and angularly offset from the second indicator.

5. The capillary of claim 1, wherein the at least one indicator is affixed to an outer surface of the tubular body.

6. The capillary of claim 1 wherein the tubular body has a circular cross section.

7. The capillary of claim 1, wherein the capillary has a non-circular face.

8. The capillary of claim 1 wherein the at least one indicator is a contact indicator.

9. The capillary of claim 1 wherein the at least one indicator is a contactless indicator.

10. The capillary of claim 1 wherein the at least one indicator is an active indicator.

11. The capillary of claim 1 wherein the at least one indicator is a passive indicator.

12. The capillary of claim 1 wherein the at least one indicator is an optical indicator.

13. The capillary of claim 1 wherein the at least one indicator is a magnetic indicator.

14. The capillary of claim 1 wherein the at least one indicator is an electrical indicator.

15. The capillary of claim 1 wherein the at least one indicator is a mechanical indicator.

16. A wire bonding system, comprising:

a source of bonding wire;

a capillary for guiding the bonding wire to a target; and at least one indicator incorporated into the capillary, an angular position of the at least one indicator about a longitudinal axis of the capillary corresponding to an angular alignment of the capillary.

17. The wire bonding machine of claim 16, further comprising a detector for detecting the angular position of the at least one indicator.

18. A method for angularly aligning a capillary, the method comprising the steps of:

establishing a first predetermined angular alignment of the capillary;

incorporating a first indicator into the capillary, an angular position of the first indicator corresponding to an angular alignment of the capillary;

detecting a first angular position of the first indicator; and comparing the first angular position of the first indicator to the first predetermined angular alignment to determine a first angular offset of the capillary from the first predetermined angular alignment.

19. The method of claim 18, further comprising the step of rotating the capillary by an amount of the first angular offset to align the capillary according to the first predetermined angular alignment.

20. The method of claim 18, further comprising the steps of:

rotating the capillary after determining the first angular offset;

detecting a second angular position of the first indicator; and comparing the second angular position of the first indicator to the first predetermined angular alignment to determine a second angular offset of the capillary from the first predetermined angular alignment.

21. The method of claim 18, further comprising the steps of:

incorporating a second indicator into the capillary, an angular position of the second indicator corresponding to an angular alignment of the capillary;

detecting a first angular position of the second indicator; and comparing the first angular position of the second indicator to the first predetermined angular alignment to determine an angular offset of the capillary from the first predetermined angular alignment.

* * * * *